(12) United States Patent
(Schropf) Grundwurmer et al.

(10) Patent No.: US 8,960,556 B2
(45) Date of Patent: Feb. 24, 2015

(54) CARD-SHAPED DATA CARRIER

(75) Inventors: Manuela (Schropf) Grundwurmer, Munich (DE); Robert Griesmeier, Bad Feilnbach (DE); Thomas Tarantino, Laufen (DE)

(73) Assignee: Giesecke & Devrient GmbH, Munich (DE)

( * ) Notice: Subject to any disclaimer, the term of this patent is extended or adjusted under 35 U.S.C. 154(b) by 704 days.

(21) Appl. No.: 12/863,942

(22) PCT Filed: Jan. 16, 2009

(86) PCT No.: PCT/EP2009/000263
§ 371 (c)(1),
(2), (4) Date: Jul. 21, 2010

(87) PCT Pub. No.: WO2009/092547
PCT Pub. Date: Jul. 30, 2009

(65) Prior Publication Data
US 2011/0101105 A1    May 5, 2011

(30) Foreign Application Priority Data

Jan. 21, 2008   (DE) .......................... 10 2008 005 320

(51) Int. Cl.
*G06K 19/02* (2006.01)
*G06K 19/07* (2006.01)
*G06K 19/077* (2006.01)
*G06K 17/00* (2006.01)

(52) U.S. Cl.
CPC .............. *G06K 19/07* (2013.01); *G06K 19/077* (2013.01); *G06K 19/07718* (2013.01); *G06K 19/07743* (2013.01); *G06K 19/07747* (2013.01); *G06K 2017/0041* (2013.01); *H01L 2224/48091* (2013.01)

USPC .......................................................... 235/488

(58) Field of Classification Search
USPC .......................................................... 235/488
See application file for complete search history.

(56) References Cited

U.S. PATENT DOCUMENTS

| | | | |
|---|---|---|---|
| 4,957,580 A * | 9/1990 | Drexler et al. | 156/250 |
| 2001/0012643 A1 * | 8/2001 | Asada | 438/107 |
| 2002/0018430 A1 * | 2/2002 | Heckenkamp et al. | 369/109.01 |
| 2005/0006481 A1 * | 1/2005 | Han et al. | 235/487 |
| 2005/0052851 A1 * | 3/2005 | Yamada et al. | 361/737 |
| 2007/0108298 A1 | 5/2007 | Kalck et al. | |
| 2008/0007409 A1 * | 1/2008 | Ferry et al. | 340/572.1 |
| 2009/0310470 A1 * | 12/2009 | Yrjonen | 369/116 |

FOREIGN PATENT DOCUMENTS

| | | | |
|---|---|---|---|
| DE | 19614808 A1 | 10/1997 | |
| EP | 1515269 A2 | 3/2005 | |
| EP | 1785916 A1 | 5/2007 | |

OTHER PUBLICATIONS

International Search Report in PCT/EP2009/000263, May 12, 2009.

* cited by examiner

*Primary Examiner* — Michael G Lee
*Assistant Examiner* — David Tardif
(74) *Attorney, Agent, or Firm* — Workman Nydegger (57) ABSTRACT

A method for producing a card-shaped data carrier directly in the ID-000 format (plug-in), and for combining the production method with the incorporation of security features, individualization data and personalization data. In so doing, a card body having ID-000 dimensions is connected directly to the rear side of a film carrier or module tape, being for example cast or injection-molded thereonto. The film carrier is preferably transparent or semitransparent. Through the film carrier the card body can be marked and inscribed by means of laser radiation.

17 Claims, 5 Drawing Sheets

CARD-SHAPED DATA CARRIER

FIELD OF INVENTION

This invention relates to the production of card-shaped data carriers for use as plug-ins, and to corresponding data carriers.

BACKGROUND

Plug-ins are understood to be chip cards in the ID-000 format. They find use primarily as SIM cards (SIM=Subscriber Identification Module) in the GSM area (GSM=Global System for Mobile Communications). The length and width dimensions are 25×15 mm, with one of the corners of the module being chamfered to thereby simplify the orientation of the card upon insertion into the card reader.

Usually, plug-ins have been produced from a card having the ISO format ID-1 with a size of 54×85.6 mm. Into the body of said card there is milled, during production, a cavity into which there is inserted a prefabricated chip card module which comprises ISO contact surfaces and a chip electroconductively contacted to the contact surfaces and potted with a plastic for protection from damage. From the ID-1 card the plug-in is then punched out. Alternatively, the card can be produced directly in the plug-in format, for example by injection molding, and the chip card module subsequently mounted therein.

If the plug-in card is not produced from an ID-1 card, accordingly adapted production equipment is required for producing the plug-ins directly in the final format.

SUMMARY

The present invention is based on the object of optimizing the production process of corresponding card-shaped data carriers, i.e. in particular data carriers intended for use as plug-ins.

The invention starts out from first making available a film carrier having a contact layout applied to its front side and contacting surfaces to its rear side. The film carrier can be supplied wound on a reel or in sheet format. A semiconductor circuit is arranged on the rear side of the film carrier, and the contacts of the semiconductor circuit connected to the contacting surfaces, for example by the conventional wire-bonding technology or flip chip technology. Then a card body, whose length and/or width dimensions correspond to the dimensions of the finished data carrier and whose thickness dimension, together with the thickness of the film carrier, yields the thickness of the finished data carrier, is connected to the rear side of the film carrier. Finally, there is detached from the film carrier an area comprising at least one contact layout and possessing the length and width dimensions of the finished data carrier. Alternatively, the detaching of said area can also be effected before or during the connecting of the card body to the rear side of the film carrier.

By means of this method there can be directly produced a card-shaped data carrier in the plug-in format in simple fashion.

For connecting the card body to the rear side of the film carrier, there are different possibilities. On the one hand, a prefabricated plug-in card body can be brought under the film carrier, by the card bodies for example being transported on a conveyor belt or an adhesive tape, and be attached to the film carrier material by suitable methods. For this purpose there can be used for example a heat-activatable adhesive or a liquid adhesive. Ultrasonic welding is also possible. In this variant, the detaching of the finished data carrier from the film carrier is effected only in a subsequent step.

According to another variant, the chip modules are produced on the film carrier in conventional fashion. This can comprise potting the semiconductor circuit with a protective potting compound. However, there can also be supplied a finished module tape on which the semiconductor circuit protected with potting compound is already present. The film carrier rear side is then brought in contact with prefabricated plug-in card bodies and connected thereto for example by a heat-activatable adhesive or a liquid adhesive system, whereby in the same production step the corresponding area is punched out from the film carrier and remains on the card body. In this implementation variant, the film carrier or module tape is preferably made available as rolled goods, and the step of detaching from the film carrier is effected here at the same time as the step of connecting the card body to the film carrier rear side.

According to a further alternative, the corresponding area of the film carrier with the semiconductor circuit can be detached from the film carrier in a first step and only be connected to a card body in a second step, by the film carrier being inserted into an injection mold and back injection molded with injection molding material in order to mold a card body to the film carrier rear side. In this variant, the detaching from the film carrier is thus effected before the step of connecting the card body to the film carrier rear side. A heat-activatable adhesive on the film carrier rear side contributes advantageously to increasing the adhesion between the injection molding material and the film carrier.

According to a further variant, foils can be stacked on the film carrier rear side until the required thickness of the plug-in to be produced is reached. At least the first foil possesses at the same time a recess in the area of the receiving, preferably potted, semiconductor circuit (chip). The foil layer system is then laminated. At the same time an adhesive layer can be provided between the film carrier and the plastic foils. Finally, the plug-ins are then punched out from the sheet in the desired format.

According to an especially preferred method, however, the card body is cast onto the film carrier rear side before the step of detaching the area comprising the contact layout from the film carrier. This can be obtained by a simple casting method or by molding by the injection molding method. In the case of injection molding the potting material, the film carrier, which can be unrolled from a reel or can be present as a sheet, is covered on the rear side with an injection mold which possesses a cavity corresponding to the dimensions of the card body to be produced. Into said cavity the injection molding material is then molded onto the film carrier rear side. It is possible to mold several card bodies onto the film carrier in one method step. The detaching of the finished data carriers from the film carrier is effected after the curing of the potting material at the earliest.

If the film carrier is made available as a sheet, it is also expedient to use another manner of applying the potting compound for forming the card body. Here, a stencil is first placed onto the rear side of the film carrier, the stencil possessing in the area of the card body to be produced recesses having the dimensions of the card body to be produced. Said recesses are filled with potting compound. After the curing of the potting compound the stencil is removed, and subsequently the finished data carriers are detached from the film carrier. Before the curing of the potting compound, excess potting compound can be removed from the stencil by means of a doctor knife in order to achieve a smooth data carrier rear side and the desired data carrier thickness.

The previously described methods can in simple fashion be combined with further steps during the data carrier production and thereby further optimized, for example with regard to the incorporation of security features, personalization features, individualization features and design features, namely when the film carrier is transparent or semitransparent to visible radiation, so that through the film carrier the card body material is visible.

Thus, there can for example be provided on the card body a design print which is visible through the film carrier.

On the other hand, it is possible to provide within the material of the card body color pigments, glitter elements, luminescent substances or other optical security elements which are visible through the film carrier. If the card body is formed by means of a potting compound, said substances and elements can be admixed to the material of the potting compound without problems.

As the material for the card body, in particular as the potting compound, there can advantageously be chosen a material which is sensitized to inscription by means of a laser radiation. To said radiation the film carrier is preferably transparent. Then the card body can be marked by means of the laser radiation through the film carrier, whereby the marking is preferably produced adjacently to the film carrier, but can also be located within the card body depending on the focusing of the laser beam (in this case the card body material must be transparent to visible radiation to permit the marking to be recognized outwardly). It is also possible that the film carrier absorbs a portion of the laser radiation itself, so that a marking arises both in the film carrier and in the card body.

Further advantageously, the film carrier can have a metal coating at least on the rear side, or be provided with such a coating, and a visible marking be produced in the metal layer through the film carrier with the laser radiation. When both the potting compound and the metal layer are to be marked by means of laser radiation, whereby laser radiation with different wavelengths can be used therefor, it is advantageous to apply the metal coating only in certain areas, so that both the potting compound and the metal coating are laser-markable in outwardly visible fashion. The laser marking is advantageously used for individualizing the data carrier, for example providing it with a serial number, and/or personalizing it, i.e. providing it for example with personal data.

For detaching an area or a finished data carrier from the film carrier there can be used a drawknife, laser beam or water jet. The detaching can also be effected by punching. If the film carrier is unwound from a reel, the detaching from the film carrier is advantageously effected by means of a band knife. That is, on a drum rotating in accordance with the take-off speed of the film carrier there is located a knife possessing the width and length dimensions of the finished data carrier. Said band knife then preferably passes into the front side of the film carrier and cuts out the desired area in the plug-in format. On the rear side there can be present on a second drum a further band knife which cooperates with the band knife on the first drum. Said second band knife can have a centering function for a card body located on the rear side of the film carrier, thereby improving the production accuracy.

BRIEF DESCRIPTION OF THE DRAWINGS

Hereinafter the invention will be described by way of example with reference to the accompanying drawings. Therein are shown.

DETAILED DESCRIPTION OF VARIOUS EMBODIMENTS OF THE DISCLOSURE

Figure 1:
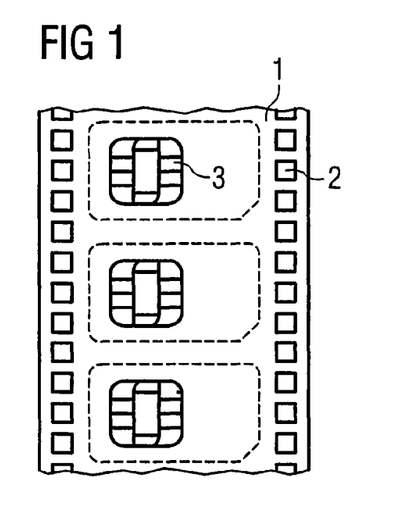
FIG. 1 a plan view of a detail of a film carrier with a contact layout in the form of rolled goods, FIG. 2a a card-shaped data carrier according to a first exemplary embodiment, FIG. 2b a card-shaped data carrier according to a second exemplary embodiment, FIG. 2c a card-shaped data carrier according to a third exemplary embodiment, FIG. 3 schematically the production process of a card-shaped data carrier starting out from a film carrier present in the form of rolled goods, FIG. 4 an exemplary embodiment for connecting a card body to a film carrier by casting, FIG. 5 the process of laser inscribing a card body through the film carrier, FIG. 6 the process of detaching a card-shaped data carrier from the film carrier by means of a band knife, FIG. 7a schematically a first production method starting out from a film carrier with a contact layout arranged in two rows, FIG. 7b schematically a second and a third production method starting out from a film carrier with a contact layout arranged in two rows, FIG. 8 the process of connecting a prefabricated card body to the film carrier, FIG. 9 a sheet-shaped film carrier with several contact layouts, FIG. 10 the production of a card body on the film carrier by casting.

FIG. 1 shows schematically a plan view of a film carrier 1 in the form of a so-called endless carrier tape. On both sides of the film carrier there are provided feed holes 2 in conventional fashion. On the front side of the film carrier 1, to be seen in a plan view here, there can be recognized a row of contact layouts 3, for example in the form of gold coating. In contrast to conventional carrier tapes, the carrier tape of the film carrier 1 depicted here has only one row of contact layouts 3 instead of two rows thereof. The area in which the second row of contact layouts 3 is normally provided is covered in the further production process by the card-shaped data carrier to be produced with the film carrier 1 and is hence to be kept free. The contour of the card-shaped data carrier to be produced is indicated in FIG. 1 by a dashed contour line.

Figure 2A:
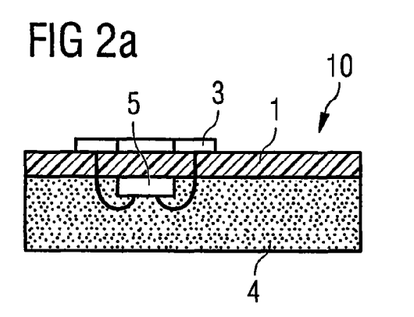
Figure 9:
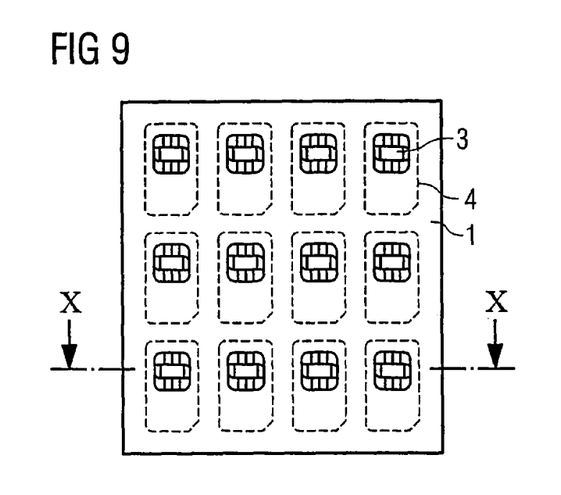

FIG. 2a shows schematically in cross section a card-shaped data carrier 10 as can be produced with the film carrier 1 according to FIG. 1 (but likewise also from a sheet-shaped film carrier according to FIG. 9). The card body 4 immediately adjacent to the film carrier 1 is formed here by a cured potting compound 4 which protectively surrounds a semiconductor circuit or chip 5, on the one hand, and together with the film carrier 1 defines the dimensions of the finished data carrier 10, on the other hand. In the exemplary embodiment according to FIG. 2a, the chip 5 is connected by wire bonding technology to contacting surfaces on the film carrier rear side which are in turn connected electroconductively to the contact layout. Instead of the wire bonding technology, the semiconductor circuit can likewise be mounted for example by flip chip technology.

Figure 2B:
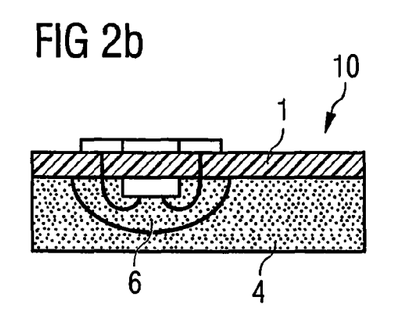

FIG. 2b shows an embodiment modified somewhat over FIG. 2a. Here, the chip 5 has first been scantily potted with a conventional potting compound 6. Only in a subsequent production step was the card body 4 then brought to plug-in size with a more cost-efficient potting compound.

Figure 2C:
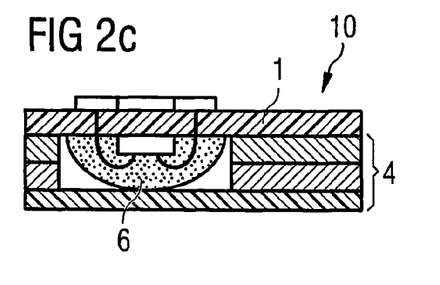

FIG. 2c shows a similar data carrier 10 to FIG. 2b. However, the card body 4 here is not formed by a potting compound, but by a layered compound which consists here specifically of three layers, two middle layers with a recess for the chip 5 potted in the potting compound 6, and one exterior cover layer. It is also possible to use more or fewer layers for forming the multilayer card body. Between the film carrier 1 and the card body layer adjacent thereto as well as between the individual card body layers there can be provided adhesive layers which support the lamination of the layered compound.

The film carrier 1 is in all cases preferably transparent or at least semitransparent to visible radiation, so that through the film carrier the card body 4 is visible. It is then possible to advantageously provide on the card body a design print that is outwardly visible but protected by the film carrier 1. If the card body 4 is formed by a potting compound, as in the exemplary embodiment according to FIGS. 2a and 2b, there can be mixed into the potting compound pigments, elements or other substances, for example color pigments, glitter elements, luminescent substances or other optical security elements, which are then visible through the film carrier.

Figure 3:
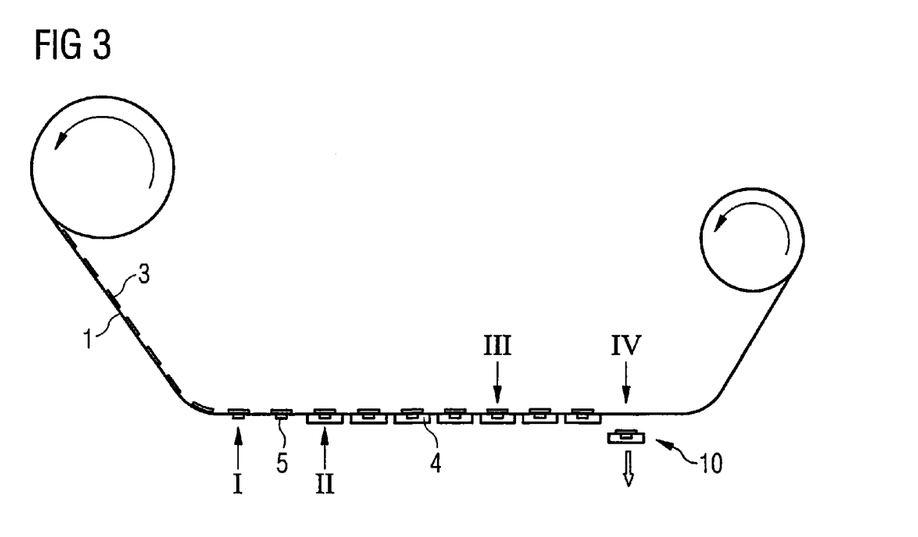

FIG. 3 shows schematically the procedure for producing card-shaped data carriers 10 in the desired final format, i.e. in particular in the ID-000 format, starting out from a film carrier 1 unwound from a reel. At first, the film carrier 1 only has a row of contact layouts 3 on its front side. On the rear side of the film carrier, a semiconductor circuit 5 is then arranged for each contact layout and electroconductively connected to contacting surfaces (not depicted here) provided on the film carrier rear side, which are in turn electroconductively connected to the contact layout on the film carrier front side. This process station is designated as I schematically in FIG. 3. It can be omitted as needed when the film carrier 1 is supplied as a finished module tape already carrying the chip 5 protected by potting compound on the film carrier rear side.

In the next station II the card body 4 is then connected to the rear side of the film carrier 1. This can be followed by a further station III in which the film carrier 1 and/or the card body 4 are marked or inscribed. For example, the card body can be printed on the card body rear side or on the card body side faces, e.g. by ink dabber printing. Alternatively or additionally, a laser marking or laser inscription can be carried out here. Also, it is possible to incorporate a label in a depression of the card body. All the above-mentioned measures are preferably performed before the card-shaped data carrier 10 is detached from the film carrier 1. However, said measures can also be carried out on the final data carrier detached from the film carrier 1. Finally, in the method depicted in FIG. 3, a finished card-shaped data carrier 10 is detached from the film carrier 1 in a further station IV.

Figure 4:
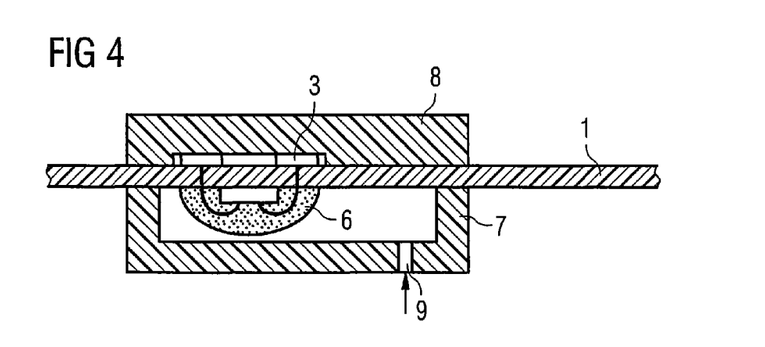

FIG. 4 shows an example for connecting a card body 4 to the film carrier 1 as could be carried out in the station II. Here, an injection mold 7, whose internal dimensions correspond to the external dimensions of the card body 4 to be produced, is placed onto the rear side of the film carrier 1 at the appropriate point. A counter-holding means 8 provides the necessary counterpressure from the front of the film carrier 1. (It should be noted that the thickness of the contact layout is depicted quite exaggeratedly for the sake of clearness here, as in all other depictions, and realistically is negligible.) Through at least one opening 9 a potting compound is injected into the cavity of the injection mold 7, filling the cavity completely. The potting compound encloses the chip, which in the depicted exemplary embodiment is already protected by a potting pill made of a first potting material. However, said potting pill can be omitted (see FIG. 2a), in particular when the semiconductor circuit is mounted on the film carrier 1 by flip chip technology. After the curing of the injected potting compound the injection mold can be opened and the film carrier 1 indexed further.

Figure 5:
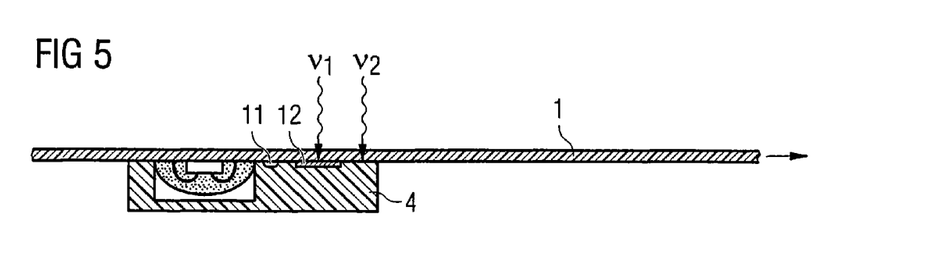

In FIG. 5 there is depicted an example of a processing station III. The card body 4 is not cast in the depicted exemplary embodiment, but consists of a prefabricated module or is of multilayer construction, as shown in FIG. 2c. The film carrier 1 is transparent or semitransparent, so that a print 11, merely suggested here, on the front side of the card body 4 adjacent to the film carrier 1 is visible through the film carrier 1. Furthermore, a metal coating 12 is provided on the stated front side of the card body 4. Said metal layer is marked or inscribed through the film carrier 1 by means of laser radiation of a first wavelength. To said first radiation the film carrier 1 is at least substantially transmissive. Beside the metal layer 12 the card body 4 is likewise marked or inscribed through the film carrier 1 by means of a second laser radiation, whose wavelength is different here to the wavelength of the first laser radiation. For this purpose the material chosen for the card body 4 is an accordingly laser-sensitive material, or the card body material is sensitized by corresponding additives such that it absorbs the relevant laser radiation. The material of the film carrier 1 must accordingly be chosen in such a way that it is just not absorbent to said laser radiation or at least passes a sufficient amount of the laser radiation for the marking of the card body 4. The laser marking serves preferably to inscribe the data carrier with individualization data or personalization data. The inscription can alternatively also be performed after the detaching of the card-shaped data carrier from the film carrier.

If the card body 4 has been produced by potting compound which was cast or injection-molded onto the film carrier 1, the metal layer 12 can be provided on the film carrier 1. That is, either the film carrier 1 is made available with such a metal layer from the start, or the metal layer is produced thereon in an intermediate step. A further metal layer can also be provided on the front side of the film carrier 1. Furthermore, it is possible to provide the film carrier 1 and/or the card body 4 with a design print or to incorporate a label in a depression (not depicted here) of the card body 4.

Figure 6:
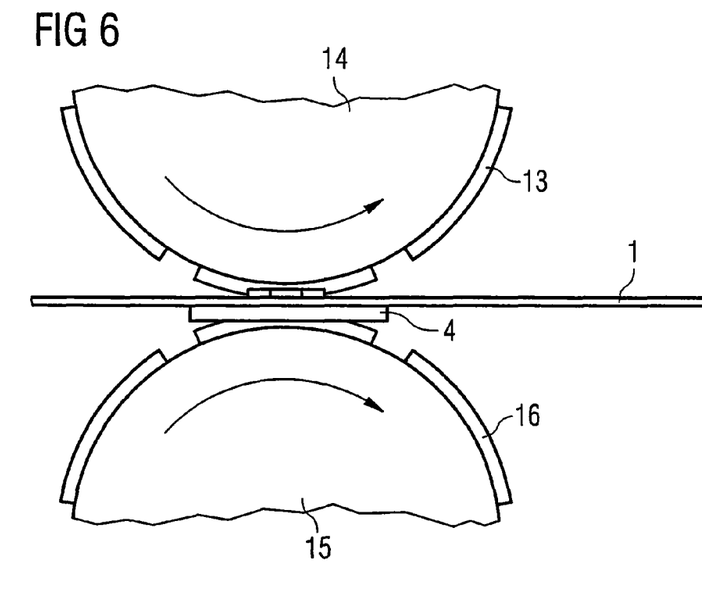

FIG. 6 shows a preferred variant of how the finished data carrier can be detached from the film carrier 1. This is done here using a band knife 13 with the outline form of the data carrier to be detached. Several such band knives are arranged so as to be uniformly distributed on the circumference of a rotating drum 14. The drum 14 rotates at a rotating speed adapted to the transport speed of the film carrier 1. At the same time the band knife passes into the film carrier 1 and cuts therethrough. On the rear side of the film carrier 1 there runs, opposite the drum 14, a drum 15 which delivers the counterpressure necessary for detaching. On the circumference of the drum 15 there are likewise provided band knives 16 which cooperate with the band knives 13 of the drum 14 upon the detaching of the card-shaped data carriers from the film carrier 1, whereby the band knives 16 on the second drum 15 exert a centering function, clearly recognizable in FIG. 6, on the data carrier to be punched out relative to the band knives 13 of the first drum 14. The band knives 16 can also be omitted, however.

Instead of a band knife, a simple drawknife can also be used for detaching the card bodies from the film carrier 1. Detaching by means of a laser beam or a water jet is also possible.

Figure 7A:
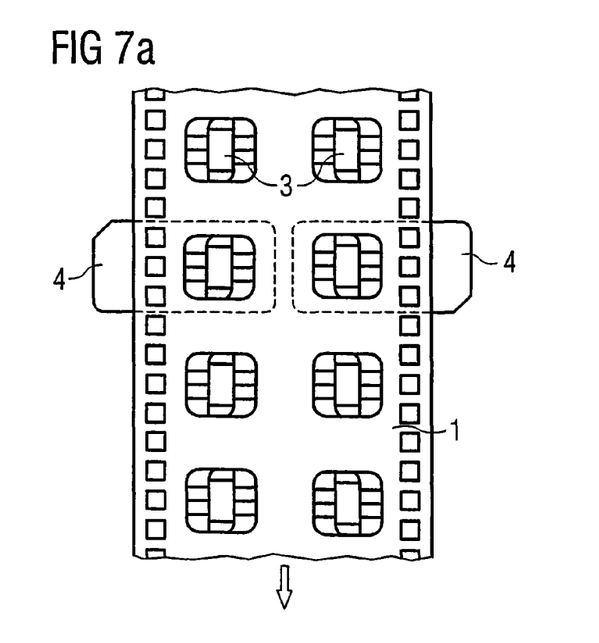

FIG. 7a shows a variant of the above-described production methods. In this variant, the starting material is a film carrier 1 comprising two rows of contact layouts 3 in conventional fashion or already present as a two-rowed module tape. Here, a prefabricated card body 4 is brought under each contact layout 3 or under each module of the film carrier 1, and in a single production step the chip module is punched out of the film carrier 1 and incorporated in a prefabricated cavity (not shown) of the card body 4. At the same time the card body protrudes laterally beyond the film carrier 1. This makes it possible to simultaneously punch out two chip modules located side by side from the film carrier 1 and to transfer them into the card bodies 4, which are for this purpose located at a 90° angle to the running direction of the carrier tape. The fixation of the punched out chip module in the cavity of the card body 4 is effected for example by heat-activatable adhesives or liquid adhesive systems.

Figure 7B:
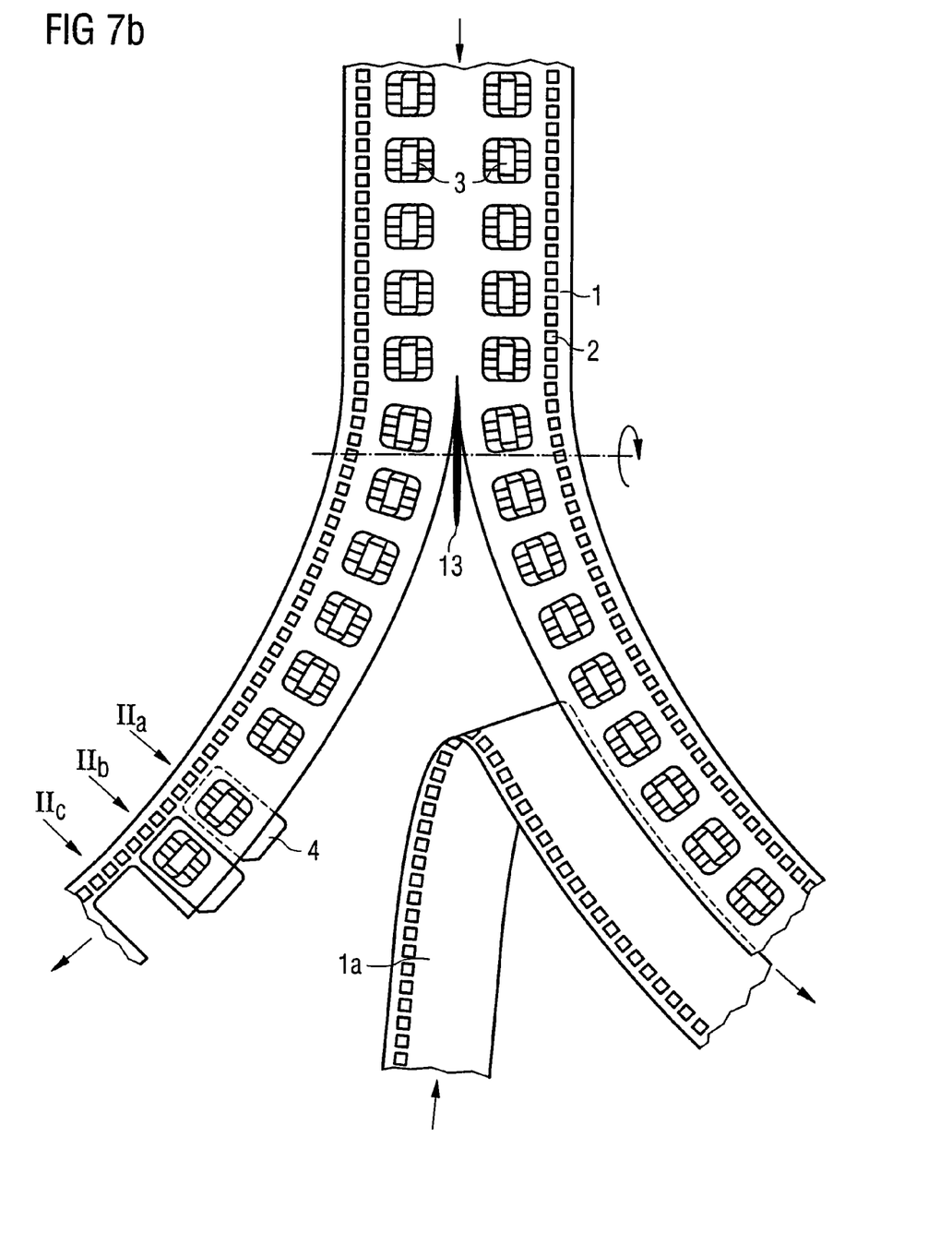

FIG. 7b shows an embodiment modified thereover, in two variants. According to said modified embodiment, the two-rowed film carrier 1 or the two-rowed module tape, which is standardly about 35 mm wide, is cut through along the longitudinal center axis, for example by means of a rotating knife 13. Subsequently, the film carrier 1 is processed further in single-track fashion. For this purpose, one chip module at a time can be punched out from the film carrier 1 and at the same moment inserted into a cavity of a prefabricated card body 4 arranged thereunder, according to the comments on FIG. 7a. Or, as shown in the left part of FIG. 7b, not only the chip module is punched out and connected to the card body 4 located thereunder, but rather an area of the film carrier 1 extending beyond the dimensions of the chip module. Said punched out area of the film carrier 1 corresponds, as far as possible, to the circumferential contour of the card body 4 located thereunder. The step of arranging the card body 4 under the film carrier 1, of cutting through the film carrier 1 along the circumferential contour and of transferring to the card body 4 is depicted in FIG. 7b for the sake of clearness in three substeps IIa, IIb and IIc at different places, but actually takes place at one and the same place.

Instead of punching out the chip module from the film carrier 1 and inserting it into the card body 4 in the exemplary embodiments according to FIGS. 7a and 7b (left variant), the card body 4 can also first be connected to the rear side of the film carrier 1, for example by gluing, and subsequently the total data carrier be punched out from the film carrier 1. The card body 4 can be built up here on the rear side of the film carrier 1 in multilayer fashion, as described above. In principle it is also conceivable, albeit more complicated in terms of process technology, to injection-mold the card body 4 onto the film carrier in the exemplary embodiments according to FIGS. 7a and 7b (left variant).

The handling of the divided carrier film is simpler in the variant depicted on the right in FIG. 7b, in which the single-track film carrier 1 is supplemented with an auxiliary carrier tape 1a such that the usual width of 35 mm is reached again. This makes it possible to employ standard machines again for processing the film carrier 1 or the chip module carrier tape.

Figure 8:
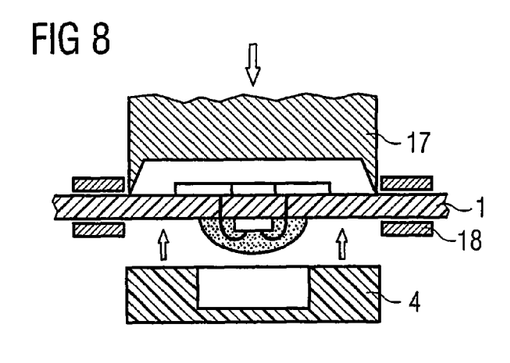

FIG. 8 shows the process of how a prefabricated card body 4 is attached to the rear side of the film carrier 1, for example by means of an adhesive, and in the same method step an area of the film carrier 1 with a circumferential contour corresponding to the card body 4 is punched out from the film carrier 1 by means of a stamping punch 17. A die 18 helps in positioning the card body 4 relative to the stamping punch 17. If only the chip module is to be punched out from the film carrier 1 and inserted into a card body 4 arranged thereunder, as described with reference to FIG. 7a, there can be used a heart [sic] stamping punch instead of the stamping punch 17 shown in FIG. 8.

Instead of starting out from a tape-shaped film carrier upon the production of the card-shaped data carrier, the film carrier can also be present in a sheet format and have at least a number of uniformly arranged semiconductor circuits 3 or already complete chip modules, as shown in FIG. 9. The distance between the semiconductor circuits 3 or chip modules is chosen so large that a corresponding number of areas with the length and width dimensions of the data carrier to be produced, in particular with the ID-000 dimension, can be detached from the film carrier 1 without coming in conflict with other semiconductor circuits 3 or chip modules. The card bodies 4 can again be placed on the rear side of the sheet-shaped film carrier 1 as prefabricated modules and glued thereto, be of multilayer construction or be produced as molded bodies by simple casting or by injection molding, whereby the detaching of the finished data carrier from the film carrier 1 is preferably effected in a last step.

Figure 10:
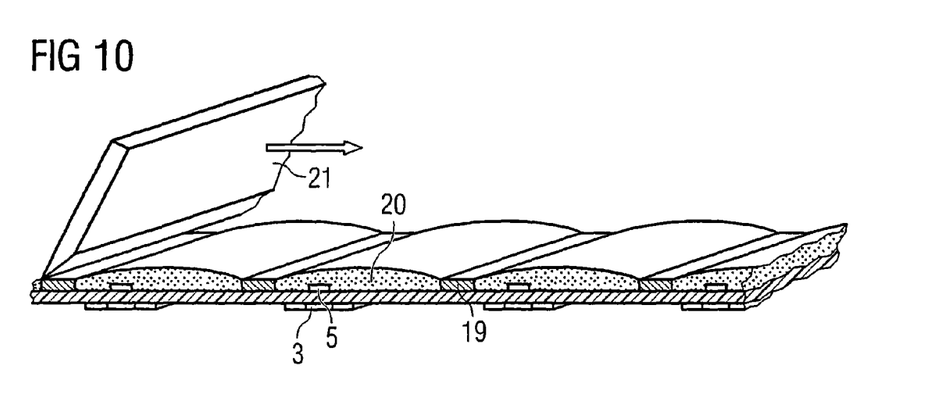

With reference to the schematic FIG. 10, it will now be explained how the card body 4 can be cast onto the rear side of the film carrier 1 in simple fashion. For this purpose there is placed onto the rear side of the sheet-shaped film carrier 1 a stencil 19 which possesses recesses with the length and width dimensions of the data carrier to be produced. Furthermore, the thickness of the stencil 19 is so chosen that, together with the thickness of the film carrier 1, it corresponds to the total thickness of the data carrier to be produced. The recesses are subsequently filled with a potting compound 20 which also surrounds the semiconductor circuit 5 mounted as a flip chip here. Excess potting material 20 is removed by means of a doctor knife 21. The flanks of the stencil are preferably coated with a material that does not form a compound with the potting compound 20, in order to facilitate later demolding.

The invention claimed is:

1. A method for producing a card-shaped data carrier, comprising the steps:
   supplying a film carrier that is transparent or semitransparent to visible radiation and having a contact layout applied to a front side of the film carrier, and contacting surfaces on a rear side of the film carrier;
   arranging a semiconductor circuit on the rear side of the film carrier and connecting contacts of the semiconductor circuit to the contacting surfaces;
   connecting a card body whose length and width dimensions correspond respectively to length and width dimensions of the finished data carrier, and whose thickness dimension, together with the thickness of the film carrier, corresponds to the thickness of the finished data carrier, to the rear side of the film carrier;
   detaching an area comprising at least one contact layout from the film carrier with at least one of a length or width dimension of the finished data carrier;
   said card body being visible through the film carrier; and
   producing visible markings on the card body by means of laser radiation through the film carrier.

2. The method according to claim 1, wherein the step of connecting the card body to the rear side of the film carrier is effected before the detaching step, and comprises applying a potting compound enclosing the semiconductor circuit to the rear side of the film carrier such that the potting compound forms the card body.

3. The method according to claim 1, wherein the connecting of the card body to the rear side of the film carrier is effected during or after the step of detaching the area from the film carrier.

4. The method according to claim 1, further comprising applying a metal coating to the rear side of the film carrier and producing visible markings in the metal layer by means of laser radiation through the film carrier.

5. The method according to claim 1, wherein the data carrier is individualizes or personalized by the visible markings produced on the card body.

6. The method according to claim 1, wherein the card body is comprised of a material into which there are mixed visually recognizable color pigments, glitter elements, luminescent substances or other optical security elements.

7. The method according to claim 6, wherein said color pigments, glitter elements, luminescent substances or other optical security elements are visible through the film carrier.

8. The method according to claim 1, comprising printing the card body on at least one of its rear side or at least one of its side faces.

9. The method according to claim 1, further comprising applying a label in a depression on a rear side of the card body.

10. The method according to claim 1, wherein detaching the area from the film carrier is effected by means of a drawknife, laser beam or water jet or by punching.

11. The method according to claim 1, further comprising unwinding the film carrier from a reel, and wherein detaching the area from the film carrier is effected by means of a band knife which is located on a drum rotating in accordance with the take-off speed of the film carrier, and which possesses the width and length dimensions of the finished data carrier.

12. The method according to claim 11, including providing a band knife on each side of the film carrier, said knives cooperating with each other upon the detaching step.

13. The method according to claim 1, wherein connecting the card body to the rear side of the film carrier comprises injection molding the card body onto the film carrier.

14. The method according to claim 2, wherein the film carrier is in the form of a sheet, and wherein the step of applying the potting compound comprises:
- placing a stencil on the rear side of the film carrier, the stencil being provided with recesses that correspond to the dimensions of the card body;
- filling potting compound into the recesses;
- curing the potting compound; and
- removing the stencil from the film carrier.

15. The method according to claim 1, including selecting a film carrier material that is transparent to the laser radiation.

16. A card-shaped data carrier for use as a plug-in, comprising:
- a film carrier having a front side and a rear side, a contact layout being applied to the front side, and contacting surfaces being applied to the rear side;
- a semiconductor circuit positioned on the rear side of the film carrier, the semiconductor circuit comprising contacts that are connected to the contacting surfaces; and
- a card body connected to the film carrier, wherein the film carrier and the card body possess at least one of the same length or width dimension and together define the thickness of the data carrier, and wherein the film carrier is transparent or semitransparent to visible radiation, so that the card body is visible through the film carrier, and wherein the card body material is sensitized for inscription by means of a laser radiation through the film carrier.

17. The card-shaped data carrier of claim 16, wherein said film carrier is transparent to the laser radiation.

* * * * *